(12) United States Patent
Cruz et al.

(10) Patent No.: US 8,876,963 B2
(45) Date of Patent: Nov. 4, 2014

(54) DIELECTRIC COATING FOR SINGLE SIDED BACK CONTACT SOLAR CELLS

(75) Inventors: Ben E. Cruz, Chula Vista, CA (US); George E. Graddy, Jr., Del Mar, CA (US); Aziz S. Shaikh, San Diego, CA (US); Jalal Salami, San Morcos, CA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 889 days.

(21) Appl. No.: 12/682,040

(22) PCT Filed: Oct. 16, 2008
(Under 37 CFR 1.47)

(86) PCT No.: PCT/US2008/080062
§ 371 (c)(1),
(2), (4) Date: Sep. 30, 2010

(87) PCT Pub. No.: WO2009/052227
PCT Pub. Date: Apr. 23, 2009

(65) Prior Publication Data
US 2012/0006393 A1   Jan. 12, 2012

Related U.S. Application Data

(60) Provisional application No. 60/980,591, filed on Oct. 17, 2007.

(51) Int. Cl.
*H01L 31/0224* (2006.01)
*H01L 31/0216* (2014.01)
*H01L 31/18* (2006.01)

(52) U.S. Cl.
CPC .. *H01L 31/022441* (2013.01); *H01L 31/02245* (2013.01); *H01L 31/1868* (2013.01); *Y02E 10/50* (2013.01); *H01L 31/022458* (2013.01)
USPC ................................ 106/287.18; 106/287.19

(58) Field of Classification Search
USPC ......................................... 106/287.18, 287.19
See application file for complete search history.

(56) References Cited

U.S. PATENT DOCUMENTS

| 3,460,956 | A | * | 8/1969 | Dahle | 106/287.18 |
| 4,084,021 | A | * | 4/1978 | Sandvig | 427/493 |
| 4,311,738 | A | * | 1/1982 | Chi | 427/387 |
| 4,328,260 | A | | 5/1982 | Whitehouse | |
| 4,341,558 | A | * | 7/1982 | Yashiro et al. | 106/14.12 |
| 4,346,324 | A | * | 8/1982 | Yoldas | 313/112 |
| 5,476,601 | A | | 12/1995 | Bershas et al. | |
| 5,538,903 | A | | 7/1996 | Aramoto et al. | |
| 2006/0234147 | A1 | | 10/2006 | Wu et al. | |

FOREIGN PATENT DOCUMENTS

| JP | S54-76629 A | 6/1979 |
| JP | S58-60581 A | 4/1983 |
| JP | S59-178778 A | 10/1984 |
| JP | 2002-83983 | 3/2002 |

OTHER PUBLICATIONS

English Translation of JP 2002-086983 (Mar. 2002).*
PatBase Patent Abstract for JP Publication No. 2002083983 published Mar. 22, 2002, one page.
International Search Report for corresponding Application No. PCT/US2008/080062 mailed Feb. 17, 2009, three pages.

* cited by examiner

*Primary Examiner* — David M Brunsman
(74) *Attorney, Agent, or Firm* — Blank Rome LLP

(57) ABSTRACT

A dielectric coating material system for use in a single-sided back contact solar cell is disclosed. The material system serves to electrically isolate electrodes of opposite polarity types on the same side of a silicon-based solar cell, and includes titanium and phosphorus.

15 Claims, 2 Drawing Sheets

DIELECTRIC COATING FOR SINGLE SIDED BACK CONTACT SOLAR CELLS

This application is a 371 filing of PCT/US08/80062, filed Oct. 16, 2008.

FIELD OF THE INVENTION

The present invention relates to a dielectric coating material for use in solar cells and methods and processes of using the same.

BACKGROUND

Solar cells are generally made of semiconductor materials, such as silicon (Si), which convert sunlight into useful electrical energy. A solar cell contact is typically made of thin wafers of Si in which the required PN junction is formed by diffusing phosphorus (P) from a suitable phosphorus source into a P-type Si wafer. The side of the silicon wafer on which sunlight is incident is usually coated with an anti-reflective coating (ARC) to prevent reflective loss of sunlight. This ARC increases the solar cell efficiency. A two dimensional electrode grid pattern known as a front contact makes a connection to the n-side of silicon, and a coating of predominantly aluminum (Al) makes connection to the p-side of the silicon (back contact). Further, contacts known as silver rear contacts, made out of silver or silver-aluminum paste are printed and fired on the p-side of silicon to enable soldering of tabs that electrically connect one cell to the next in a solar cell module. These contacts are the electrical outlets from the PN junction to the outside load.

The solar cell design in widespread use today has a PN junction formed near the front surface, where sunlight is received, which creates an electron flow as light energy is absorbed into the cell. The conventional cell design has one set of electrical contacts on the front side of the cell, and a second set of electrical contacts on the back side of the solar cell. In a typical photovoltaic module these individual solar cells are interconnected electrically in series to increase the voltage. This interconnection is typically accomplished by soldering a conductive ribbon from the front side of one solar cell to the back side of an adjacent solar cell.

Back-contact silicon solar cells have several advantages compared to conventional silicon solar cells. One is that back-contact cells have a higher conversion efficiency due to reduced or eliminated contact obscuration losses (sunlight reflected from contact grid is unavailable to be converted into electricity). Another is that assembly of back-contact cells into electrical circuits is easier, and therefore cheaper, because both conductivity type contacts are on the same surface. As an example, significant cost savings compared to present photovoltaic module assemblies can be achieved with back-contact cells by encapsulating the photovoltaic module and the solar cell electrical circuit in a single step. Yet another advantage of a back-contact cell is better aesthetics through a more uniform appearance. Aesthetics is important for some applications, such as building-integrated photovoltaic systems and photovoltaic sunroofs for automobiles.

FIG. 1 illustrates a generic back-contact cell structure as known in the art. The silicon substrate may be n-type or p-type. One of the heavily doped emitters ($n^{++}$ or $p^{++}$) may be omitted in some designs. Alternatively, the heavily doped emitters could be in direct contact with one another on the rear surface. Rear-surface passivation helps to reduce the loss of photogenerated carriers at the rear surface, and helps reduce electrical losses due to shunt currents at undoped surfaces between the contacts.

BRIEF SUMMARY OF THE INVENTION

The present invention is directed toward a dielectric coating material system useful in separating the electrodes of opposite polarity types on a back contact solar cell. In particular the invention includes a printable dielectric coating material system comprising phosphorus and a metal selected from the group consisting of titanium, tantalum and niobium. The material system comprises about 0.1 to about 10 wt % of the metal.

The invention further includes a solar cell comprising an n-conductive trace and a p-conductive trace disposed on the same side of a silicon substrate, and a dielectric layer electrically isolating the n-conductive trace from the p-conductive trace, the dielectric layer comprising phosphorus and a metal selected from the group consisting of titanium, tantalum and niobium.

The invention further involves a method for making a back-contacted photovoltaic cell, comprising: diffusing phosphorus into the front surface of a planar p-type silicon substrate; forming a metal-containing dielectric layer on top of the phosphorus diffusion and on the back surface of the substrate, wherein the metal is selected from the group consisting of titanium, tantalum, and niobium; scribing a first set of spaced apart grooves into the back surface and drilling an array of holes through the substrate to form vias such that portions of the first set of grooves are proximate to the holes; diffusing phosphorus into the vias and the first set of grooves; forming a second set of spaced apart grooves interdigitated with the first set; metallizing the vias and the first and second sets of grooves; and forming separate electrical contacts to the metallizations over the first and second sets of grooves.

Still further, the invention involves a method of making a dielectric composition for use in a solar cell comprising filtering a liquid phosphorus-containing composition, contacting an organotitanium compound with a dispersant to thoroughly wet the organotitanium compound, combining and mixing the phosphorus-containing compound with the organotitanium compound together with at least one of a vehicle, a surfactant, a diffusant, and a solvent to form a dielectric paste mixture. At no point may a metal implement be used to contain or mix the composition.

Another embodiment of the invention is a photovoltaic cell comprising: (a) a wafer comprising a semiconductor material of a first conductivity type, the wafer comprising (i) a first light receiving surface and a second surface opposite the first surface; (ii) a first passivation layer positioned over the first surface of the wafer, the first passivation layer comprising phosphorus and a metal selected from the group consisting of titanium, tantalum and niobium; (iii) a second passivation layer positioned over the second surface of the wafer; a first electrical contact comprising point contacts positioned over the second surface of the wafer, the second passivation layer comprising the same metal as in the first passivation layer and phosphorus; and having a conductivity opposite to that of the wafer; a second electrical contact comprising point contacts and positioned over the second surface of the wafer and separated electrically from the first electrical contact.

Further, the invention includes a method of making a solar cell comprising: (a) providing a liquid phosphorus-containing composition, (b) contacting an organometallic compound with a dispersant to thoroughly wet the organometallic compound, and (c) combining and mixing the phosphorus-containing composition with the organometallic compound and at least one of a vehicle, a surfactant and a solvent to form a dielectric paste mixture, wherein the organometallic compound includes a metal selected from the group consisting of titanium, tantalum, and niobium.

An embodiment of the invention involves a method of making a solar cell comprising; (a) providing a printable dielectric coating material system comprising phosphorus and about 0.1 to about 10 wt % of a metal selected from the group consisting of titanium, tantalum, and niobium, (b) applying the dielectric material system to one side of a silicon substrate; (c) applying an n-conductive paste to a first portion of the dielectric paste mixture; (d) applying a p-conductive paste to a second portion of the dielectric paste mixture, the second portion not contiguous with the first portion, to form a green body; and (e) firing to sinter the respective conductive pastes to form respective n-conductive and p-conductive traces, and fuse the dielectric paste mixture to form a dielectric layer therebetween such that the dielectric paste electrically isolates the n-conductive trace from the p-conductive trace.

Finally, another embodiment of the invention is a method of making a solar cell including providing a printable dielectric coating material system comprising phosphorus and from about 0.1 to about 10 wt % titanium, applying the dielectric material system to one side of a silicon substrate; applying an n-conductive paste to a first portion of the dielectric paste mixture; applying a p-conductive paste to a second portion of the dielectric paste mixture to form a green body; and firing the green body to sinter the respective conductive pastes to form respective n-conductive and p-conductive traces, and fuse the dielectric paste mixture to form a dielectric layer therebetween such that the dielectric paste electrically isolates the n-conductive trace from the p-conductive trace.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

BRIEF DESCRIPTION OF THE DRAWINGS

The accompanying drawings, which are schematic and not to scale, illustrate one or more embodiments of the present invention and serve to explain the principles of the invention.

DETAILED DESCRIPTION OF THE INVENTION

Figure 1:
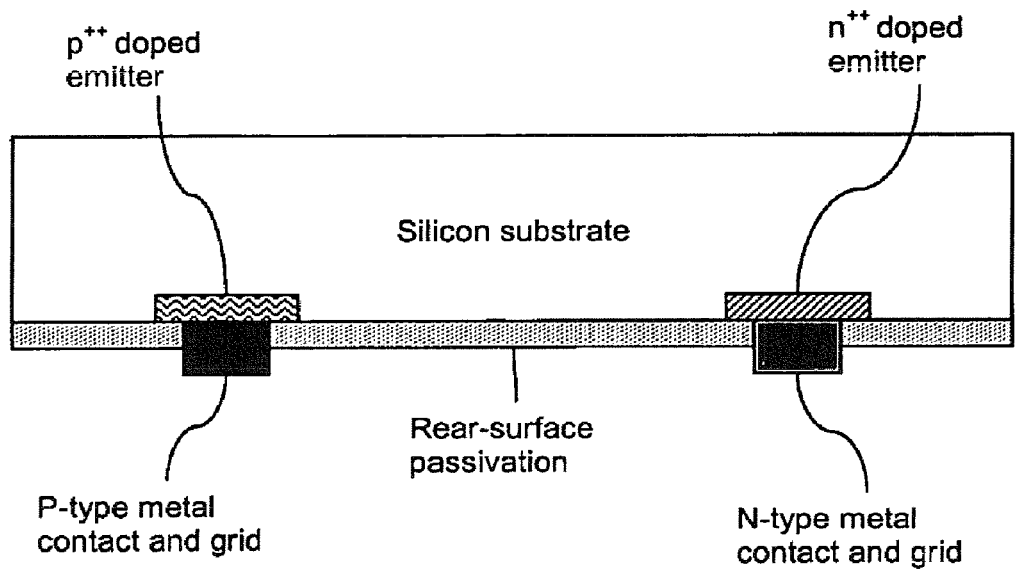
FIG. 1 is an illustration of a generic back-contact solar cell, highlighting only features on the back surface.

The invention disclosed herein provides for improved methods and processes for fabrication of back-contact solar cells, particularly methods and processes providing for more economical fabrication and more efficient configurations of rear surface contacts and grids. It is to be understood that while a number of different discrete methods are disclosed, one of skill in the art could combine or vary two or more methods, thereby providing an alternative additional method of fabrication. It is also to be understood that while the figures and exemplary process sequences describe fabrication of back-contact emitter-wrap-through (EWT) cells, there are several approaches for making a back-contact silicon solar cell. These approaches include metallization wrap around (MWA), metallization wrap through (MWT), and back junction structures, in addition to emitter wrap through. The aforementioned fabrication strategies are described below.

MWA and MWT have metal current collection grids on the front surface. These grids are, respectively, wrapped around the edge or through holes to the back surface in order to make a back-contact cell. The unique feature of EWT cells, in comparison to MWT and MWA cells, is that there is no metal coverage on the front side of the cell, which means that none of the incident light is blocked, resulting in higher efficiencies. The EWT cell wraps the current-collection junction ("emitter") from the front surface to the rear surface through doped conductive channels in the silicon wafer. "Emitter" refers to a heavily doped region in a semiconductor device. Such conductive channels can be produced by, for example, drilling holes in the silicon substrate with a laser and subsequently forming the emitter inside the holes at the same time as forming the emitter on front and rear surfaces. Back junction cells have both the negative and positive polarity collection junctions on the rear surface of the solar cell. Because most of the light is absorbed—and therefore also most of the carriers are photogenerated—near the front surface, back junction cells require very high material quality so that carriers have sufficient time to diffuse from the front to the rear surface with the collection junctions on the rear surface. In comparison, the EWT cell maintains a current collection junction on the front surface, which is advantageous for high current collection efficiency. The EWT cell disclosed in U.S. Pat. No. 5,468,652, incorporated herein by reference.

Other disclosures of module assembly and lamination using back-contact solar cells, that may be employed with the invention disclosed herein include U.S. Pat. Nos. 5,951,786, and 5,972,732, both incorporated herein by reference. U.S. Pat. No. 6,384,316, also incorporated by reference, discloses an alternative back-contact cell design, which instead employs MWT, wherein the holes or vias are spaced comparatively far apart, with metal contacts on the front surface to help conduct current to the rear surface, and further in which the holes are lined with metal. The back contacts and solar cells of U.S. Pat. App. Pub. No. 2007/0295399 are also suitable for application of the formulations herein, and the dielectric material herein may similarly used as disclosed in European Patent Application EP 1923906A1, both of which publications are incorporated herein by reference in their entireties.

An important consideration in the design of any back-contact silicon solar cell is developing a low-cost process sequence that also electrically isolates the negative and positive polarity grids and junctions. The technical issue includes patterning of the doped layers (if present), passivation of the surface between the negative and positive contact regions, and application of the negative and positive polarity contacts.

The present invention is directed toward a dielectric coating material system useful in separating the electrodes of opposite polarity types on a back contact solar cell. In particular the invention includes a printable dielectric coating material system comprising phosphorus and a metal selected from the group consisting of titanium, tantalum, and niobium, said material system comprising about 0.1 to about 10 wt % of the metal. Preferably the metal accounts for about 0.2 to about 5 wt % and more preferably 0.3 to about 2.5 wt % of the material system.

The invention further includes a solar cell comprising an n-conductive trace and a p-conductive trace disposed on the same side of a silicon substrate, and a dielectric layer electrically isolating the n-conductive trace from the p-conductive trace. The dielectric layer comprises phosphorus and a metal selected from the group consisting of titanium, tantalum and niobium.

Another embodiment of the invention is a photovoltaic cell comprising: (a) a wafer comprising a semiconductor material of a first conductivity type, the wafer comprising (i) a first light receiving surface and a second surface opposite the first surface; (ii) a first passivation layer positioned over the first surface of the wafer, the first passivation layer comprising phosphorus and a metal selected from the group consisting of titanium, tantalum and niobium; and (iii) a second passivation layer positioned over the second surface of the wafer; a first electrical contact comprising point contacts positioned over the second surface of the wafer, the second passivation layer comprising the same metal as in the first passivation layer and phosphorus; and having a conductivity opposite to that of the wafer; a second electrical contact comprising point contacts and positioned over the second surface of the wafer and separated electrically from the first electrical contact.

Yet another embodiment of the invention involves a method for making a back-contacted photovoltaic cell, comprising: diffusing phosphorus into the front surface of a planar p-type silicon substrate; forming a metal-containing dielectric layer on top of the phosphorus diffusion and on the back surface of the substrate, wherein the metal is selected from the group consisting of titanium, tantalum, and niobium; scribing a first set of spaced apart grooves into the back surface and drilling an array of holes through the substrate to form vias such that portions of the first set of grooves are proximate to the holes; diffusing phosphorus into the vias and the first set of grooves; forming a second set of spaced apart grooves interdigitated with the first set; metallizing the vias and the first and second sets of grooves; and forming separate electrical contacts to the metallizations over the first and second sets of grooves.

Another embodiment of the invention includes a method of making a dielectric composition for use in a solar cell comprising: (a) providing a liquid phosphorus-containing composition, (b) contacting an organometallic compound with a dispersant to thoroughly wet the organometallic compound, and (c) combining and mixing the phosphorus-containing composition with the organometallic compound and at least one of a vehicle, a surfactant, and a solvent to form a dielectric paste mixture, wherein the organometallic compound includes a metal selected from the group consisting of titanium, tantalum, and niobium.

Still another embodiment of the invention is a method of making a solar cell comprising; (a) providing a printable dielectric coating material system comprising phosphorus and about 0.1 to about 10 wt % of a metal selected from the group consisting of titanium, tantalum, and niobium, (b) applying the dielectric material system to one side of a silicon substrate; (c) applying an n-conductive paste to a first portion of the dielectric paste mixture; (d) applying a p-conductive paste to a second portion of the dielectric paste mixture, the second portion not contiguous with the first portion, to form a green body; and (e) firing to sinter the respective conductive pastes to form respective n-conductive and p-conductive traces, and fuse the dielectric paste mixture to form a dielectric layer therebetween such that the dielectric paste electrically isolates the n-conductive trace from the p-conductive trace. The green body may be a multilayer structure.

The invention further involves a method of making a dielectric composition for use in a solar cell comprising filtering a liquid phosphorus-containing composition, contacting an organotitanium compound with a dispersant to thoroughly wet the organotitanium compound, combining and mixing the phosphorus-containing composition with the organotitanium compound together with at least one of a vehicle, a surfactant, a diffusant, and a solvent to form a dielectric paste mixture. At no point may a metal implement be used to contain or mix the composition.

The major constituents of the dielectric coating material system disclosed herein are set forth in greater detail. Weights and other measures are by weight percentage of the overall material system and are given as a raw paste, i.e., prior to firing.

Metal. The metal, which can be titanium, tantalum or niobium, may be provided in the form of an organometallic compound. For example, the organometallic compound may be selected from the group consisting of metal ethoxide, metal 2-ethylhexoxide, metal isobutoxide, metal isopropoxide, metal methoxide, metal n-butoxide, metal n-propoxide, or other organometallic compounds. Metals in their normal metallic forms and oxides of metals may be used, but are not preferred. Combinations of the foregoing are possible. Regardless of the form of titanium provided, the material system includes about 0.1 to about 10 wt % metal, preferably about 0.2 to about 5 wt % metal and more preferably about 0.3 to about 2.5 wt % metal. Metal ethoxides are preferred.

Phosphorus. The phosphorus may be provided in the form of a liquid solution or dispersion. The phosphorus may be provided as a phosphate ester, in particular, a phosphate ester of an ethoxylated alcohol or phenol, or more generally, a phosphate ester of an alkoxylated alcohol or phenol. The alcohol or phenol can be chosen from oleyl alcohol, phenol, dinonylphenol, didecylphenol, and combinations thereof. Further suitable phosphorus esters include phosphorus methoxide, phosphorus ethoxide, phosphorus propoxide, phosphorus butoxide and further phosphorus alkoxides having up to 20 carbon atoms. Other constituents may be present, however, in a preferred embodiment the material system is devoid of intentionally added barium. Regardless of the form of phosphorus provided, the dielectric material system includes about 0.1 to about 5 wt % phosphorus, preferably about 0.2 to about 4 wt % phosphorus, and more preferably about 0.3 to about 2.5 wt % phosphorus.

Organic Component. The dielectric material system herein includes at least one of a vehicle, a solvent, a dispersant, a diffusant, and a wetting agent.

Vehicle. The material systems herein include a vehicle or carrier which is typically a solution of a resin dissolved in a solvent and, frequently, a solvent solution containing both resin and a thixotropic agent, thus forming a paste. The organics portion of the pastes comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and/or wetting agent is also envisioned. In a preferred embodiment, a measurable amount of constituents (a) through (d) above are present in the organic portions.

Ethyl cellulose is a commonly used resin. However, resins such as ethyl hydroxyethyl cellulose, wood rosin, mixtures of ethyl cellulose and phenolic resins, polymethacrylates of lower alcohols and the monobutyl ether of ethylene glycol monoacetate can also be used.

Solvent. Solvents having boiling points from about 130° C. to about 350° C. at ambient pressure are suitable. Widely used solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on aluminum or boron, to modify the contact. N-Diffusol® (ethylene glycol monomethyl ether with phosphorus pentoxide in heptane) is a stabilized liquid preparation containing an n-type diffusant with a diffusion coefficient similar to that of elemental phosphorus. Various combinations of these and other solvents can be formulated to obtain the desired viscosity and volatility requirements for each application. Other dispersants, surfactants and rheology modifiers, which are commonly used in thick film paste formulations, may be included. Commercial examples of such products include those sold under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.).

Among commonly used organic thixotropic agents is hydrogenated castor oil and derivatives thereof. A thixotrope is not always necessary because the solvent coupled with the shear thinning inherent in any suspension may alone be suitable in this regard. Furthermore, wetting agents may be employed such as fatty acid esters, e.g., N-tallow-1,3-diaminopropane di-oleate; N-tallow trimethylene diamine diacetate; N-coco trimethylene diamine, beta diamines; N-oleyl trimethylene diamine; N-tallow trimethylene diamine; N-tallow trimethylene diamine dioleate, and combinations thereof.

Figure 2:
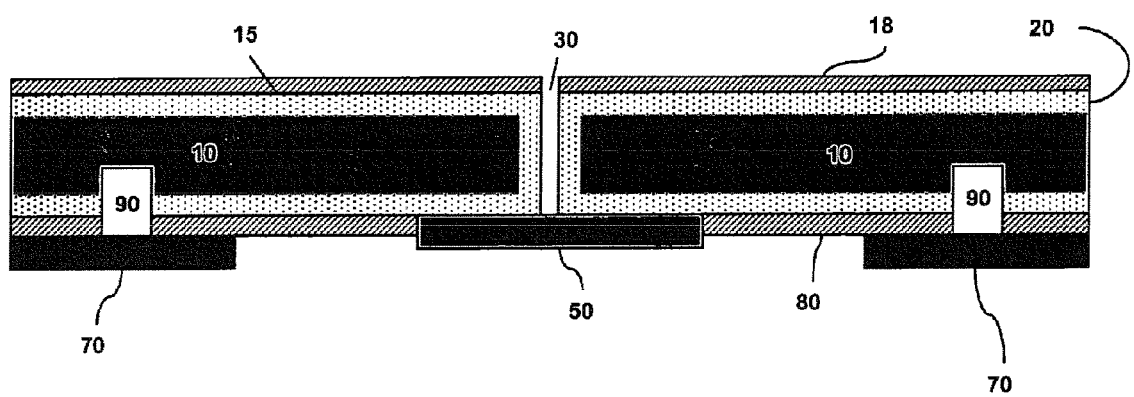
FIG. 2 is a cross-section illustration of an EWT cell of the invention with aluminum-alloyed contacts to the p-type substrate. It is a side view through a hole ("via") and perpendicular to the grid lines.

As shown in FIG. 2, an EWT cell with an Al-alloyed contact manufactured according to the present invention includes a p-type silicon wafer 10 and preferably includes n$^+$ diffusion layer 20 on substantially the entire front cell surface 15 and the walls of hole 30. The EWT cell has a high conversion efficiency because most of the rear surface is covered with the high-efficiency diffusion 20. The aluminum alloy forms heavily doped p-type contacts 90 that compensate the n$^+$ diffusion to allow contact with the p-type silicon base. The aluminum or aluminum alloy preferably reacts with silicon above the eutectic temperature.

Dielectric layer 18, including the titanium-phosphorus dielectric composition herein is disposed on front cell surface 15 in order to passivate the surface and provide an anti-reflection coating, but which could also be a nitride, such as SiN$_x$. On the rear side is disposed n-type contact and grid 50. Printed p-type contact and grid 70, preferably comprising silver, covers the Al-alloyed contact to carry current to the cell edges. Grid 70 must in this case be electrically isolated from the n$^+$ diffusion. This is preferably accomplished by the use of dielectric passivation layer 80, preferably comprising the dielectric composition of the invention, but which could also be a nitride, such as SiN$_x$. P-type contacts 90 can be made small enough so that most of the cell now has the high-efficiency n$^+$pn$^+$ structure. The percentage of the total rear surface area occupied by p-type contacts 90 is preferably less than 30%, more preferably less than 20%, and most preferably less than 10%.

Figure 3:
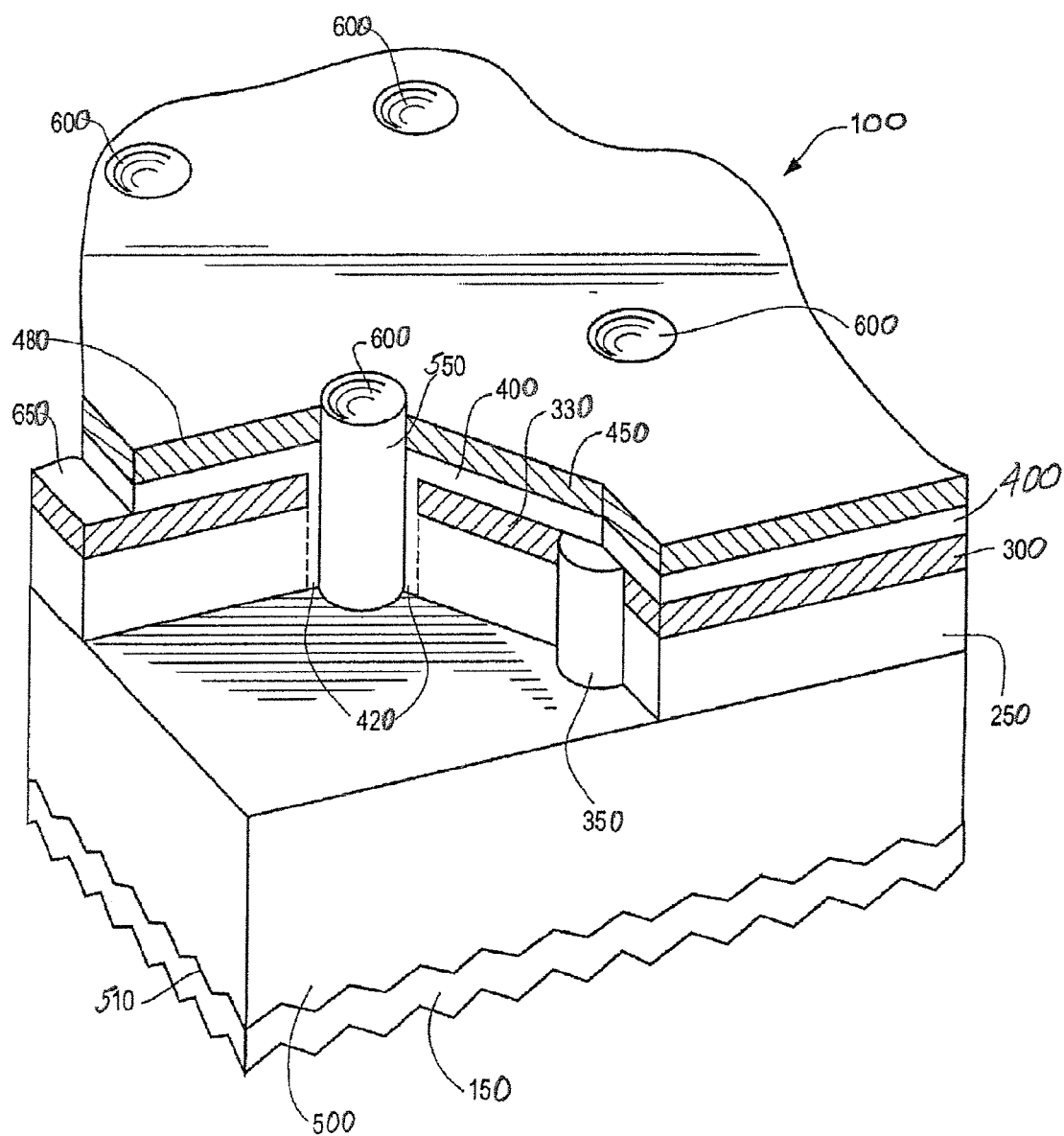
FIG. 3 is a three-dimensional, partial cut-away view of a portion of a solar cell that uses a dielectric composition in accordance with an embodiment of the invention.

FIG. 3 shows a three-dimensional, partial cut away view of a part of photovoltaic cell 100 that may benefit from the use of the metal/phosphorus dielectric material system of the invention. Photovoltaic cell 100 includes a wafer 500 of p-type crystalline silicon. The front surface of wafer 500 is textured as shown by texture line 510. Wafer 500 has a first passivation layer 150 on the front surface made of a layer of the titanium/phosphorus dielectric material system of the invention. Silicon nitride may also be used separately or in addition to the system of the invention.

Photovoltaic cell 100 has a second passivation layer 250 of the titanium/phosphorus dielectric material system of the invention or silicon nitride and is positioned in contact with wafer 500. Cell 100 has first electrical contact 300 comprising a layer portion 330 and point contacts 350. Only one point contact 350 is shown for clarity. A first electrical contact 300 comprises, for example, a metal such as tin, or tin alloyed with antimony, phosphorus, or a combination thereof. Cell 100 has an insulation layer 400 comprising the titanium/phosphorus dielectric material system of the invention electrically separating the second electrical contact 450 from first electrical contact 300. Second electrical contact 450 comprises a layer portion 480 and point contacts 550. Second electrical contact 450 comprises, for example, a metal such as aluminum. For clarity, only one point contact 550 is shown in FIG. 3. Also shown in FIG. 3 is how the dielectric layer 400 separates and electrically insulates electrical contact layer 300 from layer 450. At 420, the insulation layer extends around point contact 550 thereby electrically insulating point contact 550 from first contact 530. The thickness of the insulation layer 420 can be up to about 100 microns, for example, about 5 microns thick up to about 100 microns thick, preferably 10-90 microns, more preferably 20-80 microns, alternatively 5-25 microns or 10-20 microns. FIG. 3 also shows indentations or depressions 600 in second electrical contact 450. Such depressions, which can be crater-like in appearance, are formed by laser firing through contact layer 480 to form point contacts 550. The laser firing process to form such point contacts will be described in more detail below. FIG. 3 also shows a region 650 along the edge of cell 100 where the first electrical contact layer 300 is exposed so that an electrical connection can be made to such electrical contact. Such electrical connection may be in the form of a bus bar soldered to or otherwise electrically connected to layer 300.

The point contacts can be formed by any suitable means for forming the structures of FIG. 3. For example, they can be formed by first forming an opening or hole of a desired diameter into the layer or layers through which the point contact passes, followed by filling such hole or opening with the contact material, such as the metal. Such hole or opening can have a diameter or width of about 5 to about 100 microns corresponding to the diameter or width of the point contact. The hole or opening can be made by any suitable method such as by mechanical drilling or by using a photolithographic masking and etching process, or by ablating the material using a laser, such as an excimer laser or a Nd-YAG laser having a laser beam density sufficient to remove one or more layers through which the point contact passes. If a laser causes damage to a wafer surface when used to form a hole or opening, the wafer can be treated by hydrogen plasma or by atomic hydrogen, to remove or repair the laser damaged regions of the wafer and to passivate any remaining defects. When the point contact is formed by a method where a hole or opening in the passivation layer, for example, the titanium/phosphorus dielectric material system of the invention, is filled with the contact material, it is desirable to use a rapid thermal annealing process to cause the formation of a heavily doped region or layer adjacent to where the point contact meets the wafer.

This emitter or ohmic contact region or layer is a region or layer of the wafer that is doped by the components that form the point contact. For example, when the point contact comprises aluminum, the emitter region in an n-type wafer will be doped with aluminum. The amount of p-type doping and the depth of the doped layer or region are controlled mainly by the time and temperature of the heat treatment. Formation of such emitter and base regions by rapid thermal annealing can be accomplished by, for example, heating the contact layers to a high temperature and for a sufficient time to form the desired contact regions. For example, the contact layers can be heated in a furnace, oven, or other heating device at a set temperature within the range of about of 700 to about 1100° C., or from about 800 to about 1000° C., for about 5 seconds to about 2 minutes, or from about 10 to about 90 seconds. In the case of aluminum, for example, about one minute at about 900° C. will suffice. Another, more preferred method for forming the point contacts and corresponding emitter and ohmic regions for the photovoltaic cells of this invention, is to use a firing process using, for example, a laser. In the laser firing process, the surface of the material used for the contact, such as a layer of metal, is heated using a laser beam. The heated material such as a metal melts through the underlying layers and into the wafer. The hot metal or other material also forms the emitter or ohmic contact region, as described above, when it contacts the wafer. The laser firing process can be performed using a Q-switched, Nd-YAG laser with a pulse duration of, for example, about 10 to 100 nanoseconds. In addition to using a laser, such firing process to form the point contacts can be accomplished using, for example, electron or ion beam bombardment to heat the contact material and form the fired contact.

Although use of pure aluminum or an alloy comprising aluminum is preferred, various other alloys or pure metals, including but not limited to any self-doping p-type metallizations, may alternatively be used. The aluminum is optionally doped with one or more other p-type dopants, including but not limited to boron, palladium, platinum, gold, gallium, indium, zinc, tin, antimony, magnesium, titanium, potassium, vanadium, nickel, copper, and combinations thereof, providing a more heavily doped junction. The contact material is preferably able to compensate for the $n^+$ diffusion in order to make electrical contact to the p-type base. This preferably requires a relatively light $n^+$ diffusion (>80 ohms/sq) on the rear surface to prevent shunt currents at the $n^+$ to $p^+$ (Al-alloyed Si) junction. However, light $n^+$ diffusions are more difficult to contact. A self-doping Ag-paste contact—which contains phosphorus dopant and is designed to be fired at temperatures above the silver-silicon eutectic temperature—may optionally be used to contact the lightly doped $n^+$ diffusion. Self-doping contacts are disclosed in U.S. Pat. App. Pub. No. 2005/0172998, which is incorporated herein by reference. The self-doping contact produces a doped junction beneath the contact, which helps reduce contact resistance and reduces recombination losses. A more lightly doped $n^+$ diffusion on the front surface also has the advantage of reduced carrier losses. In the specific case of the EWT cell, the n-type species additionally functions to facilitate conduction of electronic carriers in the holes or vias. Alternatively, regions of highly and lightly phosphorus doped silicon can be formed on the rear surface, with the heavily doped $n^{++}$ regions occurring where the n-type contacts will be placed and lightly doped $n^+$ regions occurring where the Al-alloyed contact will be placed.

It is preferred that the aluminum alloy is able to alloy through (i.e., fire through) the dielectric layer on the rear surface of a solar cell. Aluminum is able to fire through various oxides. Glass frit can be added to the Al paste to facilitate firing through the dielectric layer, but such is not necessary. Alternatively, the dielectric can be removed in areas for the aluminum-alloyed contact if the Al has difficulty alloying through the dielectric layer. For example, a laser can be used to bore holes (preferably less than 50 microns in diameter) in the dielectric to expose the silicon surface. Other methods for removing the dielectric layers, such as mechanical scribing or etching (typically comprising screen printing a resist pattern, wet or dry etching the dielectric, and removing the resist), may alternatively be used.

EXAMPLES

The dielectric composition of the invention may be prepared in the following manner. Most aspects of the preparation procedure are not critical. However, it is critical to avoid all contact between reagents and reaction products with metal implements of any kind, whether mixers, containers, paddles, spoons, stir bars, spatulas, etc.

Example 1

In one laboratory procedure, Lubrhophos® LK 500 is filtered using a vacuum filtration cup and poured into a plastic or other non-metallic container for later use and storage. Lubrhophos® LK 500, available from Rhodia, Inc., includes at least 98 wt % of polyoxyethylene hexyl ether phosphate. Separately, titanium ethoxide and alpha terpineol are blended in a 61/39 weight ratio in a plastic or other non metallic container. The container is shaken for 10-20 seconds by hand to form a titanium-premix.

Into a clean 5-gallon plastic pail, the constituents of Table 1 are added in Step A.

TABLE 1

| Step A Mixture - Titanium phosphorus blend. | |
|---|---|
| Constituent (Ti—P Blend) | Weight percent |
| Terpineol Mix | 67.50 |
| Dowanol DB | 15.81 |
| Triton X-100 | 1.22 |
| Titanium premix | 5.74 |
| Lubrhophos Filtered | 1.01 |

The Step A mixture constituents are thoroughly mixed with a non-metal paddle for at least one minute until the solution becomes a uniform yellowish color. The pail is covered.

For Step B, the constituents of Table 2 are determined as follows, such that the total quantities of Steps A and B (Tables 1 and 2) total 100 weight percent.

TABLE 2

| Step B Mixture - Vehicle blend. | |
|---|---|
| Constituent (Vehicle Blend) | Weight percent |
| Ethyl Cellulose Standard 200 | 7.50 |
| Thixatrol ST | 1.22 |

In order to form 275 gram batches, the following weights (in Table 3) of constituents are weighed out into Mazerustar jars, corresponding with the wt % in Tables 1 and 2.

TABLE 3

Weights of constituents to form 275 gram batches of Ti—P dielectric.

| Constituent | Weight (grams) |
|---|---|
| Ethyl Cellulose Standard 200 | 20.62 |
| Vehicle Blend | 3.36 |
| Step A mixture | 251.02 |

The overall titanium content in the 275 gram dielectric batch is 0.73 weight percent.

The contents of a Mazerustar jar are stirred by hand to break up clumps. Two jars are placed in a Mazerustar mixer. Mazerustar is a trademark of Kurabo Industries, Ltd., Osaka, Japan. The jars are mixed on channel 6 for one cycle.

Channel 6 settings are as shown in Table 4.

| Step | Revolution | Rotation | Count | Time (sec) |
|---|---|---|---|---|
| 1 | 9 | 9 | 99 | 990 |
| 2 | 9 | 9 | 81 | 810 |
| 3 | 8 | 0 | 15 | 150 |
| | | | Total | 1950 (=32.5 min) |

DeAiring. Batches between 4 and 8 kilograms should be deaired for 70-90 minutes, while 40-60 minutes of deairing will suffice for batches from 1 to 4 kilograms. After deairing, the pail should be covered quickly and sealed with tape and allowed to stabilize overnight before testing. The resulting paste has a Viscosity of 500-700 poise (measured using a Brookfield 2XHBTCP using a CP51 cone at 2.5 RPM), preferably about 550 to about 650 poise, more preferably about 600 poise. The paste has a solids level of about 1 to 2 wt %, preferably about 1.25 to about 1.75 wt %, more preferably about 1.5 wt %.

Example 2

By a procedure similar to that in Example 1, Lubrhophos® LK 500 is filtered using a vacuum filtration cup and poured into a plastic or other non-metallic container for later use and storage. Lubrhophos® LK 500, available from Rhodia, Inc., includes at least 98 wt % of polyoxyethylene hexyl ether phosphate. Separately, tantalum ethoxide and alpha terpineol are blended in a (2:1) weight ratio (67%/33%) in a plastic or other non metallic container. The container is shaken for 10-20 seconds by hand to form a tantalum-premix.

Into a clean 5-gallon plastic pail, the constituents of Table 5 are added in Step A.

TABLE 5

Step A Mixture - Tantalum phosphorus blend.

| Constituent (Ta—P Blend) | Weight percent |
|---|---|
| Terpineol Mix | 67.00 |
| Dowanol DB | 16.31 |
| Triton X-100 | 1.22 |
| Tantalum premix | 5.25 |
| Lubrhophos Filtered | 1.50 |

The Step A mixture constituents are thoroughly mixed with a non-metal paddle for at least one minute until the solution is well mixed and homogenized. The pail is covered.

For Step B, the constituents of Table 6 are determined as follows, such that the total quantities of Steps A and B (Tables 5 and 6) total 100 weight percent.

TABLE 6

Step B Mixture - Vehicle blend.

| Constituent (Vehicle Blend) | Weight percent |
|---|---|
| Ethyl Cellulose Standard 200 | 7.50 |
| Thixatrol ST | 1.22 |

In order to form 275 gram batches, the following weights (in Table 3) of constituents are weighed out into Mazerustar jars, corresponding with the wt % in Tables 1 and 2.

TABLE 7

Weights of constituents to form 275 gram batches of Ta—P dielectric.

| Constituent | Weight (grams) |
|---|---|
| Ethyl Cellulose Standard 200 | 20.62 |
| Vehicle Blend | 3.36 |
| Step A mixture | 251.02 |

The overall tantalum content in the 275 gram dielectric batch is 1.56 weight percent.

The remaining procedures of Example 1 (de-airing, etc) are repeated for Example 2.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:

1. A printable dielectric coating material system comprising phosphorus and a metal selected from the group consisting of titanium, tantalum, and niobium, said material system comprising about 0.1 to about 10 wt % of the metal, wherein the phosphorus is provided as an ester.

2. The material system of claim 1, wherein the phosphorus is provided as a phosphate ester of an alkoxylated alcohol, alkoxylated phenol, or a combination thereof.

3. The material system of claim 2, wherein the alkoxylated alcohol or alkoxylated phenol is selected from the group consisting of alkoxylated oleyl alcohol, alkoxylated phenol, alkoxylated dinonylphenol, alkoxylated didecylphenol, and combinations thereof.

4. The material system of claim 2, wherein the alkoxylated alcohol or alkoxylated phenol is an ethoxylated alcohol or ethoxylated phenol selected from the group consisting of ethoxylated oleyl alcohol, ethoxylated phenol, ethoxylated dinonylphenol, ethoxylated didecylphenol, and combinations thereof.

5. The material system of claim 1, wherein the phosphorus is provided as a phosphate ester of an alkoxide group or an ethoxide group.

6. The material system of claim 1, wherein the ester is an alkoxylated phosphate ester.

7. The material system of claim 1, wherein the ester is an ethoxylated phosphate ester.

8. The printable dielectric coating material system of claim 1, wherein the material system is devoid of barium.

9. The printable dielectric coating material system of claim 1, wherein the phosphorus is present in an amount of about 0.1 to about 5 wt %, based upon the total weight of the material system.

10. The printable dielectric coating material system of claim 9, wherein the phosphorous is present in an amount of about 0.2 to about 4 wt. %, based upon the total weight of the material system.

11. The printable dielectric coating material system of claim 10, wherein the phosphorous is present in an amount of about 0.3 to about 2.5 wt. %, based upon the total weight of the material system.

12. A method of making a dielectric composition for use in a solar cell comprising:
   a. providing a liquid phosphorus-containing composition,
   b. contacting an organometallic compound with a dispersant to thoroughly wet the organometallic compound, and
   c. combining and mixing the phosphorus-containing composition with the organometallic compound and at least one of a vehicle, a surfactant, and a solvent to form a dielectric paste mixture, wherein the organometallic compound includes a metal selected from the group consisting of titanium, tantalum, and niobium.

13. The method of claim 12, wherein the liquid phosphorus-containing compound is filtered.

14. The method of claim 12, wherein in (c), a glass frit is further combined and mixed with the phosphorus-containing compound and organometallic compound.

15. The method of claim 12, wherein no metal implement comes into contact with any composition, compound, dispersant, vehicle, surfactant, solvent or paste at any time.

* * * * *